(12) United States Patent
Ito (10) Patent No.: US 8,298,905 B2
(45) Date of Patent: Oct. 30, 2012

(54) METHOD FOR FORMING FUNCTIONAL ELEMENT USING METAL-TO-INSULATOR TRANSITION MATERIAL, FUNCTIONAL ELEMENT FORMED BY METHOD, METHOD FOR PRODUCING FUNCTIONAL DEVICE, AND FUNCTIONAL DEVICE PRODUCED BY METHOD

(75) Inventor: Daisuke Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 253 days.

(21) Appl. No.: 12/720,220

(22) Filed: Mar. 9, 2010

(65) Prior Publication Data

US 2010/0233874 A1 Sep. 16, 2010

(30) Foreign Application Priority Data

Mar. 16, 2009 (JP) ................................. 2009-062759

(51) Int. Cl.
*H01L 21/20* (2006.01)
(52) U.S. Cl. ........ 438/385; 438/600; 438/660; 438/661; 438/662; 257/665; 257/776; 257/E21.591; 257/E21.592; 257/E23.148
(58) Field of Classification Search .................. 438/385, 438/600, 660, 661, 662; 257/665, E21.591, 257/E21.592, E23.147–E23.149, 776
See application file for complete search history.

(56) References Cited

U.S. PATENT DOCUMENTS

| | | | | |
|---|---|---|---|---|
| 6,653,704 B1* | 11/2003 | Gurney et al. | ................. | 257/421 |
| 2002/0030439 A1* | 3/2002 | Gurvitch et al. | ............. | 313/498 |
| 2006/0231872 A1 | 10/2006 | Kim et al. | | |
| 2007/0069193 A1 | 3/2007 | Yoon et al. | | |
| 2010/0208503 A1* | 8/2010 | Kuo | ................................ | 365/51 |

FOREIGN PATENT DOCUMENTS

| | | |
|---|---|---|
| JP | 2002-158418 | 5/2002 |
| JP | 2006-526273 | 11/2006 |
| JP | 2007-515055 | 6/2007 |
| JP | 2007-224390 | 9/2007 |
| JP | 2007-225532 | 9/2007 |
| JP | 2008-205104 | 9/2008 |

OTHER PUBLICATIONS

"Thermal Memory Technology", IBM Technical Disclosure Bulletin, Mar. 1985, vol. 27, pp. 6158-6163.*
Hyun-Tak Kim et al.; Raman study of electric-field-induced first-order metal-insulator transition in VO2-based devices; Applied Physics Letters 86; 242101;, Jun. 7, 2005.
Beth S. Guiton et al.; Singe-Crystaline Vanadium Dioxide Nanowires with Rectangular Cross Sections; JACS; 127, 498-499;, Dec 26, 2004.

* cited by examiner

*Primary Examiner* — Julio J Maldonado
*Assistant Examiner* — Maria Ligai
(74) *Attorney, Agent, or Firm* — SNR Denton US LLP

(57) ABSTRACT

A method for forming a functional element includes a first step of forming an insulating layer composed of an insulator phase of a transition metal oxide serving as a metal-to-insulator transition material, the transition metal oxide being mainly composed of vanadium dioxide, and a second step of causing part of the insulating layer to transition to a metallic phase, in which the insulator phase differs from the metallic phase in terms of electrical resistivity and/or light transmittance.

12 Claims, 9 Drawing Sheets

METHOD FOR FORMING FUNCTIONAL ELEMENT USING METAL-TO-INSULATOR TRANSITION MATERIAL, FUNCTIONAL ELEMENT FORMED BY METHOD, METHOD FOR PRODUCING FUNCTIONAL DEVICE, AND FUNCTIONAL DEVICE PRODUCED BY METHOD

BACKGROUND OF THE INVENTION

1. Field of the Invention

The present invention relates to a method for forming a functional element using vanadium dioxide ($VO_2$) as a metal-to-insulator transition material, a functional element formed by the method, a method for producing a functional device, and a functional device produced by the method.

2. Description of the Related Art

Hitherto, wiring for use in semiconductor devices including active elements and passive elements has been composed of a metal such as aluminum or copper. A wiring pattern is formed by a step of forming a metal film by, for example, sputtering or evaporation of a metal, a step of forming a resist layer, a step of exposing a mask, a developing step, a step of etching a metal film, a step of removing the resist layer, and so forth. In the case where a wiring pattern is not formed by a single layer, the wiring pattern is separated into a plurality of wiring layers. The wiring layers are electrically connected through via plugs provided between the layers.

For example, Japanese Unexamined Patent Application Publication No. 2002-158418 (see paragraph Nos. 0005 to 0008 and 0015 to 0018, and FIG. 1) entitled "Wiring board and method for producing same" discloses a technique in which a wiring pattern is formed without using an etching step and the wiring pattern can be changed and modified even after the formation of the wiring pattern. The following is described in this patent document.

In a wiring board including wiring between elements (for example, electronic or electric circuits), the wiring is formed of a conductive state of a photo-induced phase transition material that can exist in an insulating state, which is a stable state, and the conductive state, which is a metastable state.

Regarding a method for producing the wiring board, in a step of forming a conductive state of the photo-induced phase transition material by light, the wiring pattern is formed with a mask or is directly formed by laser scanning irradiation.

The material used for the wiring is mainly composed of a transition metal or an oxide thereof that undergoes a phase transition by light irradiation or heat application. Typical examples of such a transition metal oxide include compounds represented by the formula $A_xB_yO_z$ (wherein x, y, and z are in the ranges of $1 \leq x \leq 14$, $1 \leq y \leq 24$, and $1 \leq z \leq 41$; and A and B may be the same or different elements). In the transition metal oxide, energy states of atoms seem to be changed by light irradiation to cause the displacement of a crystalline lattice, so that a phase transition phenomenon occurs. These are described in Japanese Unexamined Patent Application Publication No. 2002-158418.

An example of a material exhibiting a metal-to-insulator transition is vanadium dioxide ($VO_2$). $VO_2$ is an oxide which has a monoclinic structure at room temperature and undergoes the metal-to-insulator transition at about 68° C. to a rutile structure. The electrical resistivity of $VO_2$ changes three orders of magnitude or more. $VO_2$ is used for an infrared bolometer-type temperature sensor because of a high rate of change in electrical resistivity with temperature (for example, see Japanese Unexamined Patent Application Publication No. 2007-225532 (paragraph No. 0036 to 0041, and FIG. 1).

Vanadium dioxide has a different crystal phase, $VO_2$ (B), which does not exhibit the metal-to-insulator transition. Thus, vanadium dioxide that exhibits the monoclinic-to-rutile transition is usually expressed as $VO_2$ (M) or $VO_2$ (R).

A thin film of vanadium dioxide usually expressed as $VO_2$ (M) or $VO_2$ (R) is reported to be subjected to the metal-to-insulator transition by the application of an electric field. There is a possibility that vanadium dioxide can be applied to field-effect transistors, switching elements, and memory elements (for example, see PCT Japanese Translation Patent Publication No. 2006-526273 (paragraph Nos. 0025 to 0028, FIGS. 3 to 5), Japanese Unexamined Patent Application Publication No. 2007-224390 (paragraph Nos. 0026 to 0039 and 0077 to 0080, FIGS. 1 and 11 to 13), PCT Japanese Translation Patent Publication No. 2007-515055 (paragraph Nos. 0007 to 0022, FIGS. 1 and 2), Japanese Unexamined Patent Application Publication No. 2008-205140 (paragraph Nos. 0049 and 0058 to 0065, FIGS. 4 and 6 to 9), B. Guiton et al., "Single-Crystalline Vanadium Dioxide Nanowire with Rectangular Cross Sections", JACS, 127, 498-499 (2005) (page 498, left column, lines 22 to 36, and page 499, right column, lines 12 to 15), H-T. Kim, et al. "Raman study of electro-field-induced first-order metal-to-insulator transition $VO_2$-based devices", Applied Physics Letters, 86, 242101 (2005) (242101-2, left column, FIG. 1).

SUMMARY OF THE INVENTION

Steps of forming wiring patterns have been complicated in the past. After the formation of the wiring pattern, even if part of the wiring pattern is intended to be changed, it is difficult to change part of the wiring pattern. In a multilayer wiring pattern, it is very difficult to change the wiring located in a deep layer. To change such a wiring pattern, preferably, electrical wiring can be freely formed and erased nondestructively.

To increase the flexibility of the change of electrical wiring in a circuit and achieve integration, the layout of the electrical wiring can be preferably changed and erased. To achieve the electrical wiring, a method for forming and erasing a thin metal wiring in any portion is preferably employed. In an integrated circuit formed in a deep portion that is not exposed at a surface, it is difficult to locally remove only electrical wiring by a chemical or physical technique.

Electrical wiring in a circuit is formed according to a layout plan. It is difficult to reconfigure the wiring. In particular, an integrated circuit includes a large amount of fine wiring; hence, it is very difficult to reconfigure the wiring.

In logic circuits almost constituting specialized system circuits, the circuits do not have general versatility. The circuits have specialized layout plans for devices. Thus, the production cost is extremely increased as the number of different products is increased.

In the case where the system circuits are generalized and wiring is formed after the completion of a production process, different specialized system circuits can be formed on the same layout plan, leading to a significant reduction in cost. Furthermore, a system operation test can be performed on an actual circuit, and then the circuit can be improved in situ, thus saving time and labor for the production of a test circuit.

An integrated circuit in which wiring is erasable should provide effects of reducing the cost and the development time. Furthermore, such an integrated circuit should be applied to a real-time reconfigurable circuit (dynamic reconfigurable circuit) for a brain-type information processor as a quasi-synaptic element.

Reconfigurable electric circuits have been provided in the past. In the circuits, wiring is not changed. Passages of electric signals are changed using FETs serving as switches. That is, it is difficult to increase the flexibility of changes of the circuits. The number of FET switches is extremely increased as the flexibility is increased, causing difficulty in increasing densities of the circuits.

In the FET switches, the information of the reconfigured circuit is usually erased when a power supply is turned off; hence, the power supply is not turned off. The circuit information is typically maintained using a battery. To overcome the situation, a prototype ferroelectric gate FET, in which information is not erased when a power supply is turned off, is produced, the FET including a gate insulating film composed of a ferroelectric material. However, the FET is not used practically because a thin film is formed at a high temperature and contains low-melting-point metal element, such as lead or bismuth.

There is a circuit in which information is stored in nonvolatile memory and the information is read after rebooting the product. However, the number of FET switches is further increased, thereby difficulty in increasing densities of the circuit and generalization.

Japanese Unexamined Patent Application Publication No. 2002-158418 describes in the step of forming the conductive state of the photo-induced phase transition material by light, the wiring pattern is formed with the mask or is directly formed by laser scanning irradiation. In a technique described in this patent document, in the case of changing the conductive wiring pattern, i.e., in the case of reconfiguring the wiring, the wiring pattern in the conductive state is heated to 600° C. or higher, thereby resulting in the insulating state and erasing the wiring. At a temperature of 600° C., substantially all elements are damaged, causing a malfunction. Thus, in the technique described in Japanese Unexamined Patent Application Publication No. 2002-158418, even if the wiring pattern can be formed of the photo-induced phase transition material, it is difficult to reconfigure the wiring in the device after mounting or forming a component.

It is desirable to provide a method for forming a functional element using vanadium dioxide ($VO_2$) as a metal-to-insulator transition material, a functional element formed by the method, a method for producing a functional device, and a functional device produced by the method.

According to an embodiment of the present invention, there is provided a method for forming a functional element (e.g., a lead selected from 20a to 20e, 23, 25a, 25b, and 80a to 80c described in an embodiment below), the method including a first step of forming an insulating layer composed of an insulator phase of a transition metal oxide (e.g., vanadium dioxide 10 or 60 described in an embodiment below) serving as a metal-to-insulator transition material, the transition metal oxide being mainly composed of vanadium dioxide, and a second step of causing part of the insulating layer to transition to a metallic phase, in which the insulator phase differs from the metallic phase in terms of electrical resistivity and/or light transmittance.

It is thus possible to form the functional element that can have states with different electrical resistivities and/or light transmittances resulting from the phase transition of the metal-to-insulator transition material.

According to an embodiment of the present invention, there is provided a functional element formed by the method for forming a functional element described above.

It is thus possible to provide the functional element that can have states with different electrical resistivities and/or light transmittances resulting from the phase transition of the metal-to-insulator transition material.

According to an embodiment of the present invention, there is provided a method for producing a functional device, the method including the method for forming a functional element described above.

It is thus possible to provide the method for producing a functional device including the functional element that can have states with different electrical resistivities and/or light transmittances resulting from the phase transition of the metal-to-insulator transition material.

According to an embodiment of the present invention, there is provided a functional device produced by the method for producing a functional device.

It is thus possible to provide the functional device that can have states with different electrical resistivities and/or light transmittances resulting from the phase transition of the metal-to-insulator transition material.

BRIEF DESCRIPTION OF THE DRAWINGS

FIGS. 3A (a) to 3C (b) are plan views illustrating the formation and the reconfiguration of wiring by the use of the phase transition to a metallic phase of a metal-to-insulator transition material according to an embodiment of the present invention;

DESCRIPTION OF THE PREFERRED EMBODIMENTS

The method for forming a functional element according to an embodiment of the present invention preferably includes a third step of causing at least part of the metallic phase to transition to the insulator phase. That is, the state of the functional element is preferably erased by causing at least part of the functional element constituted by the metallic to transition to the insulator phase. In other words, the state of the functional element is preferably erasable. According to the method, the functional element can be formed in the second step, and the functional element can be erased in the third step.

In the third step, at least part of the metallic phase is preferably heated to a temperature which is higher than a metal-to-insulator transition temperature of the transition metal oxide and which is equal to or lower than 100° C. and then cooled to a temperature lower than the metal-to-insulator transition temperature, thereby causing the at least part of the metallic phase to transition to the insulator phase. According to the method, even in the case where the functional element formed by heating the transition metal oxide to a temperature which is higher than the metal-to-insulator transition temperature and which is equal to or lower than 100° C. is used together with a component that will be thermally degraded at a temperature exceeding 100° C., the component is not degraded on erasing the state of the functional element.

The transition metal oxide preferably contains at least one 3d transition metal element other than vanadium (V). In this case, a metal-to-insulator transition material having a metal-to-insulator transition temperature different from that of the foregoing metal-to-insulator transition material can be used. Thus, the heating temperature at which the functional element is erased can be adjusted by selecting the 3d transition metal element.

The 3d transition metal element is preferably selected from Ti, Cr, Mn, Fe, Co, Ni, and Cu. In this case, the metal-to-insulator transition material having a metal-to-insulator transition temperature of 20° C. to 100° C. can be used. Thus, the heating temperature at which the functional element is erased can be adjusted by selecting the 3d transition metal element.

In the second step, a region of the insulating layer located between conductors is preferably irradiated with laser light to form the metallic phase configured to connect the conductors to each other. In this case, a functional element configured to connect the conductors to each other is formed of the metallic phase.

In the first step, a plurality of the insulating layers are preferably stacked. In this case, functional elements can be formed in the plural insulating layers.

In the second step, a region of each of the plural insulating layers, the region being located between corresponding conductors, is preferably irradiated with laser light to form the three-dimensionally arranged metallic phase. In this case, three-dimensionally arranged functional elements configured to connect the conductors are formed of the metallic phases.

The functional element is preferably formed as electrical wiring. In this case, the metallic phase serves as the electrical wiring. It is possible to provide the wiring that can be formed and erased, i.e., erasable wiring, at a temperature of room temperature to 100° C.

The functional element is preferably formed as a resistance element. In this case, the metallic phase serves as the resistance element. It is possible to provide the resistance element that can be formed and erased, i.e., erasable resistance element, at a temperature of room temperature to 100° C.

The functional element is preferably formed as a relay switch. The metallic phase constituting the functional element undergoes the phase transition to the insulator phase that functions as a switching element in an off state. The insulator phase constituting the switching element in an off state undergoes the phase transition to the metallic phase that functions as the switching element in an on state. In this way, an electrical switching is preferably performed by the metal-to-insulator transition of the transition metal oxide. In this case, it is possible to provide the relay switch that can be formed and erased, i.e., erasable relay switch, at a temperature of room temperature to 100° C.

Preferably, the metallic phase differs from the insulator phase in terms of light transmittance, and the functional element is formed as an optical storage element of an optical storage medium in which information is stored and/or read with light. In this case, it is possible to provide the optical storage element that can be formed and erased, i.e., erasable optical storage element, at a temperature of room temperature to 100° C.

Preferably, the metallic phase differs from the insulator phase in terms of light transmittance, and the functional element is formed as a display element of a display unit in which information is displayed using the difference in terms of light transmittance. In this case, it is possible to provide the display element that can be formed and erased, i.e., erasable display element, at a temperature of room temperature to 100° C.

In a method for producing a functional device according to an embodiment of the present invention, the functional device preferably includes an organic semiconductor circuit having an organic semiconductor element, a semiconductor logic circuit having a logic element, a thin-film FET, a display unit, and an optical storage medium. According to the method, even in the case where the organic semiconductor circuit, the semiconductor logic circuit, the thin-film FET, the display unit, and the optical storage medium are thermally degraded at a temperature exceeding 100° C., the organic semiconductor circuit, the semiconductor logic circuit, the thin-film FET, the display unit, and the optical storage medium are not degraded on forming or erasing the functional element.

The phenomenon of the metal-to-insulator transition is a phenomenon in which a material changes from a state exhibiting metallic properties to a state showing insulating properties. In the case where any portion of a region composed of a material showing the metal-to-insulator transition phenomenon undergoes the phase transition, a conductive state can be controlled in such a manner that a portion of the region is the metallic phase and that a portion of the region is the insulator phase. The insulator phase is a low-temperature phase. The metallic phase is a high-temperature phase. The functional element can be formed in any portion by the use of the material showing the metal-to-insulator transition phenomenon. The "functional element" is used to indicate an element formed by the use of the difference in terms of electrical resistivity and/or light transmittance between the low-temperature phase and the high-temperature phase. For example, the functional element can be formed as metallic wiring (conductive wiring).

In an embodiment of the present invention, vanadium dioxide ($VO_2$) is used as a bistable metal-to-insulator transition material (Mott insulator) exhibiting the phenomenon of the metal-to-insulator transition and showing a metallic state and an insulator state. It is possible to form the erasable functional element, for example, metallic wiring (conductive wiring), in which the insulator phase is subjected to the phase transition to the metallic phase by irradiating any portion of a region composed of $VO_2$ with laser light.

For example, in the case where the functional element, e.g., electrical wiring, is formed on a surface of an insulating substrate where plural conductive electrode terminals are arranged, a $VO_2$ thin film serving as a metal-to-insulator transition material is first formed on the surface so as to be in contact with at least part of each of the conductive electrode terminals. Next, laser irradiation is performed in such a manner that desired conductive electrode terminals are connected, thereby causing the insulator phase of a portion of the $VO_2$ thin film located a region irradiated with laser light to transition to the metallic phase to form electrical wiring. In this way, it is possible to electrically connect the desired conductive electrode terminals to each other.

The whole or part of a region where the electrical wiring is formed as described above is heated to a temperature, e.g., 100° C., higher than a phase-transition temperature of $VO_2$ by infrared laser irradiation. The whole or part of the region is then cooled to a temperature, e.g., room temperature, lower than the phase-transition temperature of $VO_2$ from the metallic phase to the insulator phase. In this way, the whole or part of the electrical wiring is erased by causing the metallic phase constituting the metallic wiring to transition to the insulator phase.

Hence, it is possible to form or eliminate (erase) the functional element by the use of the metal-to-insulator transition of the $VO_2$ thin film and thus provide the erasable functional element.

Regarding the foregoing erasable functional element, e.g., metallic wiring, a plurality of the erasable functional elements may be formed, i.e., multilayer wiring may be formed. It is possible to erase any metallic wiring formed in any layer.

As described above, it is possible to form or erase the foregoing functional element, e.g., metallic wiring, and thus provide the erasable metallic wiring.

The functional element, e.g., metallic wiring, according to an embodiment of the present invention can undergoes the metal-to-insulator transition into an insulator. The metallic phase can be subjected to the phase transition to the insulator phase. The metallic wiring is adjustable because the metallic wiring is erasable. The adjustable wiring can be formed and erased without using chemical or physical etching and is thus erasable.

Thus, the functional element, e.g., erasable metallic wiring, can be formed by forming a metal-to-insulator transition material ($VO_2$) in an integrated circuit used for a functional device such as an electronic device or a functional component such as electronic component and irradiating any portion of a region composed of the metal-to-insulator transition material with light.

Regarding a three-dimensional circuit including plural subcircuits, the diameter and the depth position of a light spot obtained by conversing irradiation light can be changed by adjusting a focal length (length between the lens and the light spot) and the depth of focus (in-focus range) with a conversing lens used for irradiation light, thereby changing the functional element, e.g., metallic wiring, deeply-arranged in a functional device such as an electronic device or a functional component such as an electronic component. Furthermore, if a light-introducing portion is arranged in an integrated circuit chip, light can be introduced into the chip through the light-introducing portion after the formation of the chip, thereby erasing the functional component.

In the electrical wiring serving as the functional element according to an embodiment of the present invention, any portion of a region formed in a predetermined position in a functional device such as an electronic device or a functional component such as an electronic component and composed of the metal-to-insulator transition material is scanned with laser light having a specific wavelength. This causes the metal-to-insulator transition, forming a metallic portion in any two- or three-dimensional position in the functional device such as the electronic device or the functional component such as the electronic component. The metallic portion can serve as electrical wiring (metallic-phase line).

Note that it is also possible to arrange both wiring (unerasable wiring) composed of a metal material, e.g., Cu, Al, Au, or Ag, and the metallic wiring (erasable wiring) formed of the metallic phase obtained by the phase transition of $VO_2$ in a functional device such as an electronic device or a functional component such as an electronic component.

Embodiments of the present invention will be described in detail below with reference to the attached drawings.

Embodiment

Metal-to-Insulator Transition

Typical examples of a metal-to-insulator transition material include perovskite oxides and rutile oxides containing 3d transition metal elements; organic strongly-correlated electron materials such as BEDT-TTF; and chalcogenide-based compounds such as GeSbTe.

Typical examples of perovskite oxides containing 3d transition metal elements include $CaTiO_3$, $SrTiO_3$, $BaTiO_3$, $LaTiO_3$, $(La,Sr)TiO_3$, $SrCeO_3$, $LaFeO_3$, $(La,Ca)MnO_3$, $(La,Sr)MnO_3$, $(La,Ba)MnO_3$, $(Pr,Ca)MnO_3$, $(La,Sr)CoO_3$, $(La,Sr)VO_3$, and $SmNiO_3$.

Typical examples of rutile oxides containing 3d transition metal elements include $TiO_2$, $VO_2$, $MnO_2$, and $CrO_2$.

A typical example of the organic strongly-correlated electron materials is a charge-transfer complex containing BEDT-TTF ($C_{10}H_8S_8$, bis(ethylenedithio)tetrathiafulvalene) serving as a donor and X serving as an acceptor, wherein X represents $I_3$, MM'(SCN)$_4$ (M=Nb, Tl, or Cs; M'=Co or Zn)), or Cu[N(CN)$_2$]Cl.

GeSbTe, which is a typical example of chalcogenide-based compounds, is a phase change material. Crystalline GeSbTe has a high electrical conductivity. Amorphous GeSbTe has an electrical conductivity several orders of magnitude lower than that of crystalline GeSbTe.

It is known that light irradiation causes these metal-to-insulator transition materials to transition. It is suggested that metallic wiring can be formed and erased by the use of the metal-to-insulator transition.

In this specification, the term "metallic wiring" is used to indicate conductive wiring (metallic-phase wiring) formed by the phase transition of the metal-to-insulator transition material ($VO_2$). In the following description, electrical wiring will be taken as an example of the functional element.

Formation of Vanadium Dioxide ($VO_2$) Thin Film

A metal-to-insulator transition material used in an embodiment of the present invention is vanadium dioxide ($VO_2$). Currently, there is no material that undergoes the metal-to-insulator transition at a temperature of room temperature to 100° C. other than $VO_2$. $VO_2$ usually has a phase-transition temperature of about 68° C. A phase at a temperature higher than the phase-transition temperature, i.e., a high-temperature phase, is a metallic phase and has a tetragonal crystal structure. A phase at a temperature lower than the phase-transition temperature, i.e., a low-temperature phase, is an insulator phase and has a monoclinic crystal structure. The high-temperature phase has a low visible-light transmittance and is colored. The low-temperature phase is nearly colorless.

$VO_2$ may contain an additional element other than vanadium (V). Examples of the additional element M include Fe, Co, Ni, Mo, Nb, and W. $VO_2$ doped with the additional element M, i.e., $VO_2$:M, has a lowered phase-transition temperature. The phase-transition temperature of $VO_2$ doped with a 3d transition metal element (different from V) can be changed in the range of 20° C. to 100° C. by adjusting the type and the concentration of additional element.

$VO_2$ may be deposited on a substrate composed of, for example, $TiO_2$, $Al_2O_3$, or Si, by sputtering, vacuum evaporation, chemical vapor deposition (CVD), pulsed laser deposition, or the like.

Examples of sputtering that can be employed include common techniques, such as direct-current sputtering, high-frequency sputtering, magnetron sputtering, and reactive sputtering. Examples of vacuum evaporation that can be employed include common techniques, such as electron beam (EB) deposition.

Pulsed laser deposition (PLD) is a method in which a target is subjected to pulsed laser irradiation in a vacuum chamber and then fragments (atoms, molecules, ions, clusters, and so forth) from the plasma of the target are deposited on a substrate. The plasma of the target substance is referred to as a plume. Properties of a thin film formed by pulsed laser deposition are determined by the type of substrate, the temperature of the substrate, the target substance, the distance between the substrate and the target, the type of atmospheric gas, the pressure of the gas, the wavelength of laser light, irradiation energy (density), the oscillatory frequency of the pulsed laser light, the pulse width, and the irradiation time.

In the case where a functional device to which the method for forming a functional element according to an embodiment of the present invention is applied is, for example, an organic semiconductor circuit including an organic semiconductor element, a semiconductor logic circuit including a logic element, a thin-film FET, a display unit, or an optical storage medium, a $VO_2$ thin film is desirably formed at a low temperature, preferably, at 100° C. or lower in order to suppress the thermal degradation of the functional device. The heating temperature of a substrate on which the $VO_2$ thin film is formed is preferably 100° C. or lower. Under the temperature condition, even if the functional device contains an organic substance, it is possible to prevent the thermal degradation of the organic substance.

Formation of Electrical Wiring

The irradiation of light having a wavelength of 500 nm or less causes the insulator phase of $VO_2$ to transition to the metallic phase. Note that the absorption spectrum of the metal-to-insulator transition material varies depending on its composition. The upper limit of the wavelength of irradiation light used to cause the material to transition also varies depending on the composition of the material. In $VO_2$ doped with an element M other than vanadium (V), i.e., $VO_2$:M, the upper limit of the wavelength of irradiation light used to cause the insulator phase of $VO_2$:M to transition to the metallic phase is set to an optimized value corresponding to the type and the concentration of the additional element M.

Figure 1A:
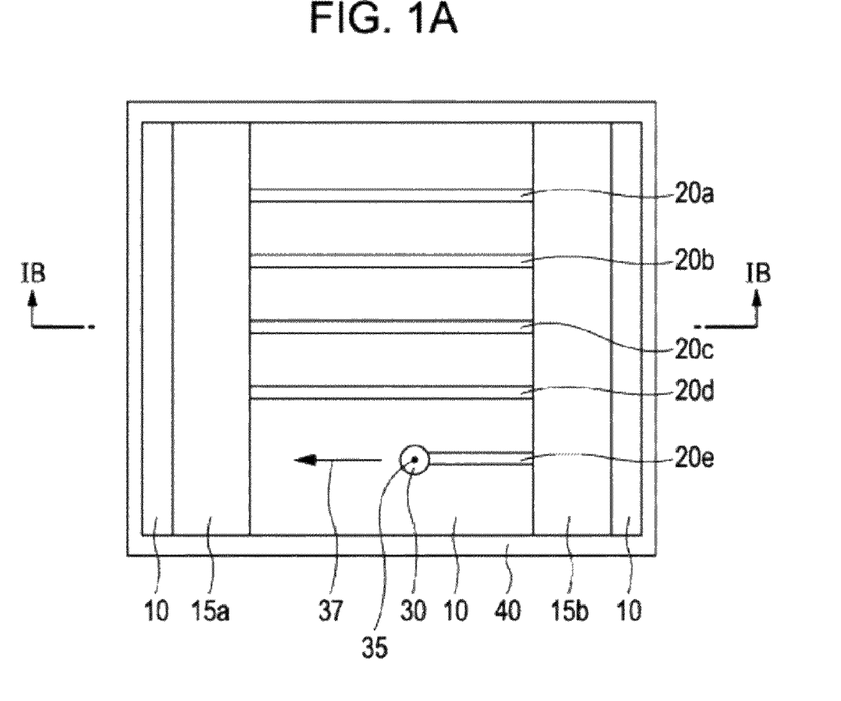
FIGS. 1A and 1B illustrate the formation of metallic wiring according to an embodiment of the present invention, the wiring being formed by causing a metal-to-insulator transition material to transition to a metallic phase by laser scanning.
Figure 1B:
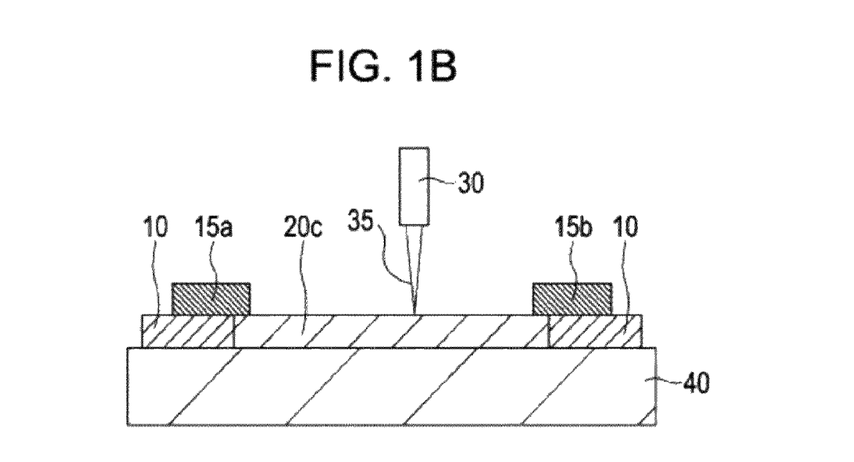

FIGS. 1A and 1B illustrate the formation of metallic wiring as an example of a functional element according to an embodiment of the present invention, the functional element being formed by causing a metal-to-insulator transition material ($VO_2$) to transition to a metallic phase by laser scanning. FIG. 1A is a plan view. FIG. 1B is a cross-sectional view taken along line IB-IB.

As shown in FIGS. 1A and 1B, a $VO_2$ thin film serving as the metal-to-insulator transition material 10 is arranged on a surface of a substrate 40. Two conductive electrodes 15a and 15b parallel to each other are arranged on the surface of the $VO_2$ thin film and separated by a predetermined distance. FIGS. 1A and 1B illustrate the formation of a plurality of metallic leads 20a, 20b, 20c, 20d, and 20e each configured to connect the two conductive electrodes 15a and 15b to each other.

The metallic leads 20a to 20e are formed by scanning portions of the $VO_2$ thin film with laser light 35 from a laser light source 30 (produces laser light with a wavelength of 488 nm) in the scanning direction 37 to cause the portions of the $VO_2$ thin film irradiated with the laser light 35 to transition from the insulator phase to the metallic phase. Regarding the metallic lead 20e, a state of the scanning of the laser light 35 is shown. Alternatively, the substrate 40 may be moved without moving the laser light 35 while the position of the laser light source is fixed.

The widths of the metallic leads 20a to 20e formed by causing the metal-to-insulator transition material ($VO_2$) to transition to the metallic phase are determined by the width of the laser light with which the $VO_2$ thin film is irradiated or by an area continuously scanned with the laser light 35. Furthermore, the diameter and the depth position of a laser spot obtained by conversing the laser light can be changed by adjusting a focal length and the depth of focus with a conversing lens used for irradiation light 35. That is, the depth of focus is set to a value equal to or more than the thickness of the $VO_2$ thin film, causing the entire $VO_2$ thin film in the thickness direction to transition to the metallic phase.

Erasure of Electrical Wiring

The resulting metallic leads 20a to 20e can be erased as described below. For example, a region where the metallic leads 20a to 20e are arranged is irradiated with infrared (IR) laser light having a wavelength of 800 nm or more, heating the region to a high temperature, e.g., 100° C., which causes $VO_2$ to transition to the metallic phase. Then the region is cooled to a low temperature, e.g., room temperature, which causes $VO_2$ to transition to the insulator phase, thereby erasing the metallic leads 20a to 20e. Note that the region may be heated with a heater in place of IR laser irradiation.

As described above, the $VO_2$ thin film used for the formation of the electrical wiring is heated to about 100° C. and then left to cool to room temperature, causing the metallic phase of the $VO_2$ thin film to transition to the insulator phase. Thereby, the electrical wiring is erased.

In the case where the entire surface of a component is heated with a heater or by infrared irradiation from an image light source or a laser light source, the whole of the electrical wiring arranged in the component is erased, and the $VO_2$ thin film returns to the initial state, i.e., the insulator phase, without the wiring.

The electrical wiring can be partially or locally erased by converging infrared light having a wavelength of 800 nm or more. A laser light source may be used as an infrared light source configured to emit infrared light having a wavelength of 800 nm or more in addition to an image light source. Furthermore, in the case where a plurality of insulating layers formed of $VO_2$ thin films are arranged in a component, electrical wiring can be formed or erased in each of the insulating layers as described below (see FIG. 5).

As described above, the metallic wiring formed by the phase transition of the insulator phase of the $VO_2$ thin film can be erased by heating with the heater or by irradiation of infrared light having a wavelength of 800 nm or more and then cooling.

Figure 2:
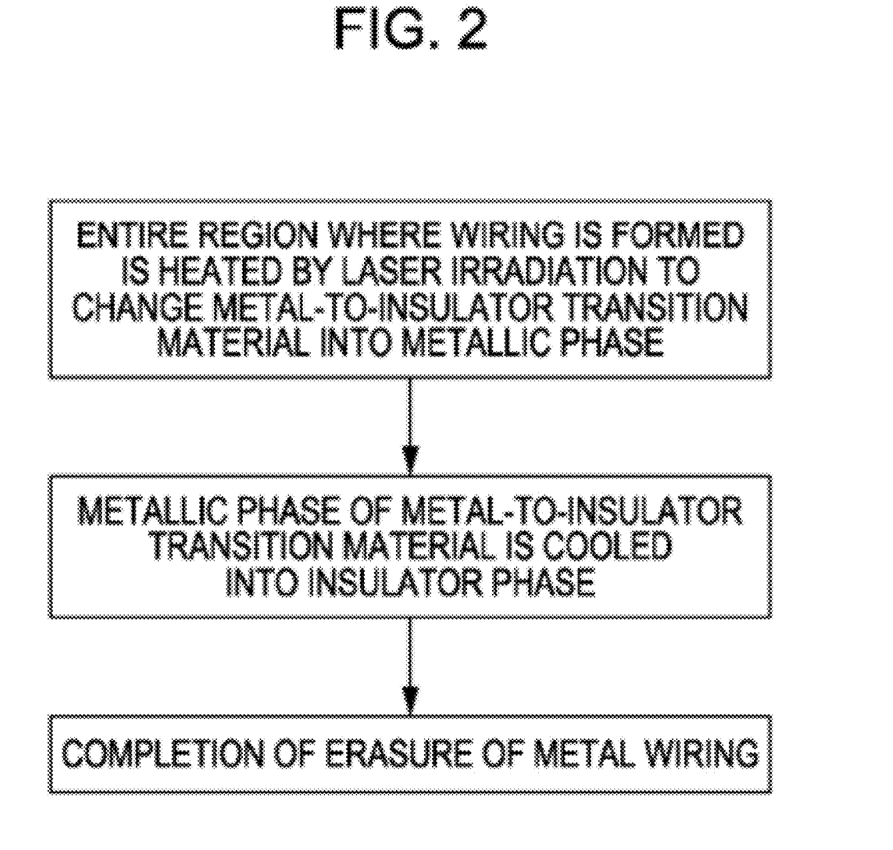
FIG. 2 illustrates the erasure of metallic wiring according to an embodiment of the present invention, the wiring being formed by causing a metal-to-insulator transition material to transition to a metallic phase by laser scanning.

FIG. 2 illustrates the erasure of metallic wiring as an example of a functional element according to an embodiment of the present invention, the functional element being formed by causing a metal-to-insulator transition material ($VO_2$) to transition to a metallic phase by laser scanning.

As shown in FIG. 2, the entire region where the metallic leads 20a to 20e are formed is heated to a high temperature of about 100° C. by infrared laser irradiation, causing the entire metal-to-insulator transition material 10 ($VO_2$) to transition to the metallic phase. The region is then cooled to a low temperature, i.e., room temperature, causing the entire metal-to-insulator transition material 10 (VO$_2$) and erasing the metallic leads.

Furthermore, a specific portion of the metallic leads 20a to 20e, for example, only a region where the metallic lead 20c shown in FIGS. 1A and 1B is formed is heated to a high temperature of about 100° C. by infrared laser irradiation. The region is then cooled to a low temperature, i.e., room temperature, changing the specific lead portion into the insulator phase and erasing the specific portion of the metallic leads.

Formation and Erasure of Metallic Wiring

Figure 3A:
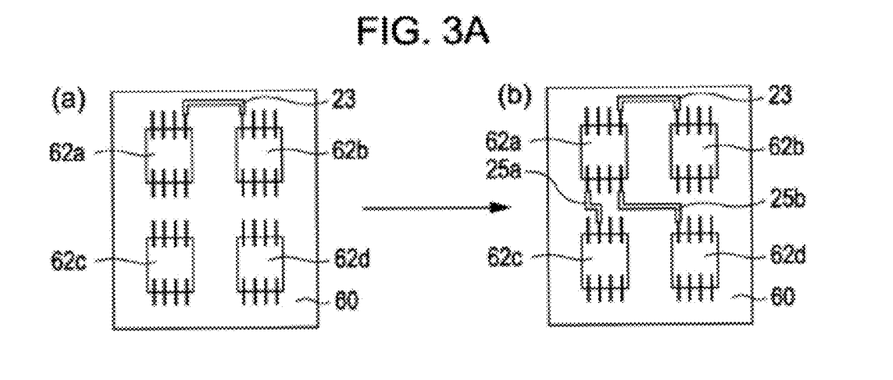
Figure 3B:
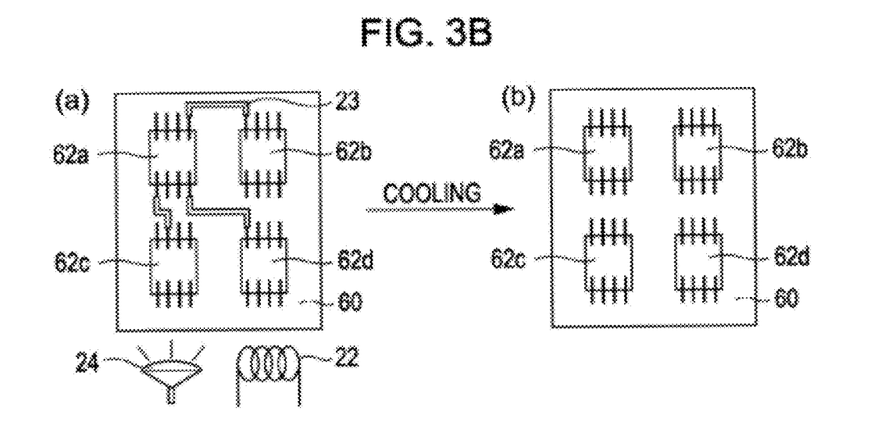
Figure 3C:
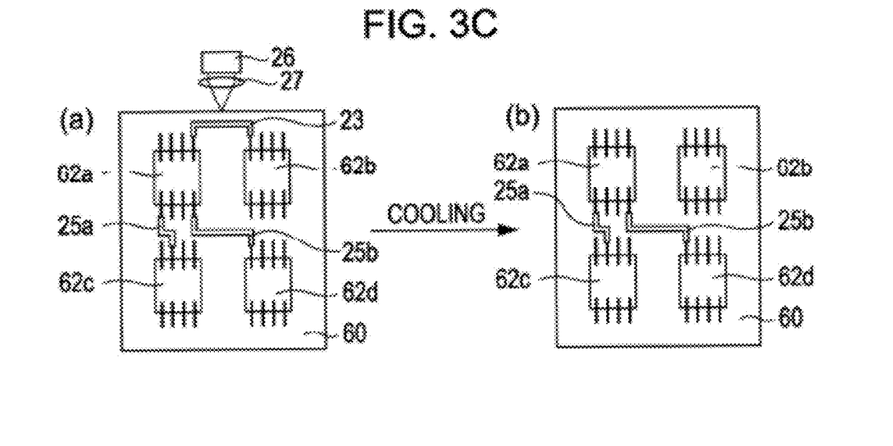

FIGS. 3A (a) to 3C (b) illustrate the formation and erasure of metallic wiring as an example of a functional element according to an embodiment of the present invention, the functional element being formed by causing a metal-to-insulator transition material (VO$_2$) to transition to a metallic phase by laser scanning.

In FIGS. 3A (a) to 3C (b), the metal-to-insulator transition material 60 (VO$_2$) is arranged on a surface of each substrate (not shown).

FIGS. 3A (a) to 3C (b) illustrate the erasure of wiring (including the addition of wiring). FIGS. 3A (a), 3B (a), and 3C (a) illustrate the state of wiring before the erasure of wiring. FIG. 3A (b) illustrates a wiring state after the addition of leads. FIGS. 3B (b) and 3C (b) illustrate wiring states after the erasure of wiring.

FIG. 3A (a) shows an exemplary electronic circuit including a plurality of semiconductor chips 62a to 62d mounted on the metal-to-insulator transition material 60 (VO$_2$) on the substrate, the circuit including a lead 23 (metallic wiring) indicated by a thick line. The lead 23 is formed by causing the metal-to-insulator transition material 60 (VO$_2$) to transition to the metallic phase by laser scanning as described above. The existing lead 23 connects between the semiconductor chip 62a and the semiconductor chip 62b.

Additional wiring can be formed in the electronic circuit shown in FIG. 3A (a). FIG. 3A (b) shows an exemplary electronic circuit including newly added leads 25a and 25b, the lead 25a connecting between the semiconductor chip 62a and the semiconductor chip 62c, and the lead 25b connecting between the semiconductor chip 62a and the semiconductor chip 62d. The newly added leads 25a and 25b are formed by causing the metal-to-insulator transition material 60 (VO$_2$) to transition to the metallic phase by laser scanning as described above.

The semiconductor chips 62a to 62d are mounted on the metal-to-insulator transition material 60 (VO$_2$) arranged on the substrate prior to the formation of the electronic circuit shown in FIG. 3A (a). This will be described below (with reference to FIGS. 4A and 4B).

Erasure of All Electrical Wiring

FIGS. 3B (a) and 3B (b) illustrate the erasure of all wiring. FIG. 3B (a) illustrates a wiring state before the erasure of the wiring (the same as the wiring state shown in FIG. 3A (b)). FIG. 3B (b) illustrates a wiring state after the erasure of all wiring.

As shown in FIGS. 3B (a) and 3B (b), the entire region where the wiring is arranged is heated to a high temperature (e.g., 100° C.) equal to or higher than a metal-to-insulator transition temperature with a heater 22 or an infrared lamp 24 and then cooled to a low temperature, i.e., room temperature, causing all metallic wiring to transition to the insulator phase and thus erasing all metallic wiring.

Erasure of Part of Electrical Wiring

FIGS. 3C (a) and 3C (b) illustrate the erasure of part of wiring. FIG. 3C (a) illustrates a wiring state before the erasure of the wiring (the same as the wiring state shown in FIG. 3A (b)). FIG. 3C (b) illustrates a wiring state after the erasure of part of the wiring.

As shown in FIGS. 3C (a) and 3C (b), a region where the lead 23 (metallic wiring) is arranged is heated to a high temperature (e.g., 100° C.) equal to or higher than the metal-to-insulator transition temperature by scanning with infrared light emitted from the infrared lamp 24 and then converged by a lens 27. Next, the region is cooled to a low temperature, i.e., room temperature, causing the region where the lead 23 is arranged to transition to the insulator phase and thus erasing the lead 23. Note that an infrared laser light source may be used in place of the infrared lamp 24.

The formation and the erasure of the single-layer metallic wiring have been described above. As will be described below, the formation and the erasure of the multilayer metallic wiring can also be performed (see FIG. 5).

Mounting of Electronic Component on Substrate

Figure 4A:
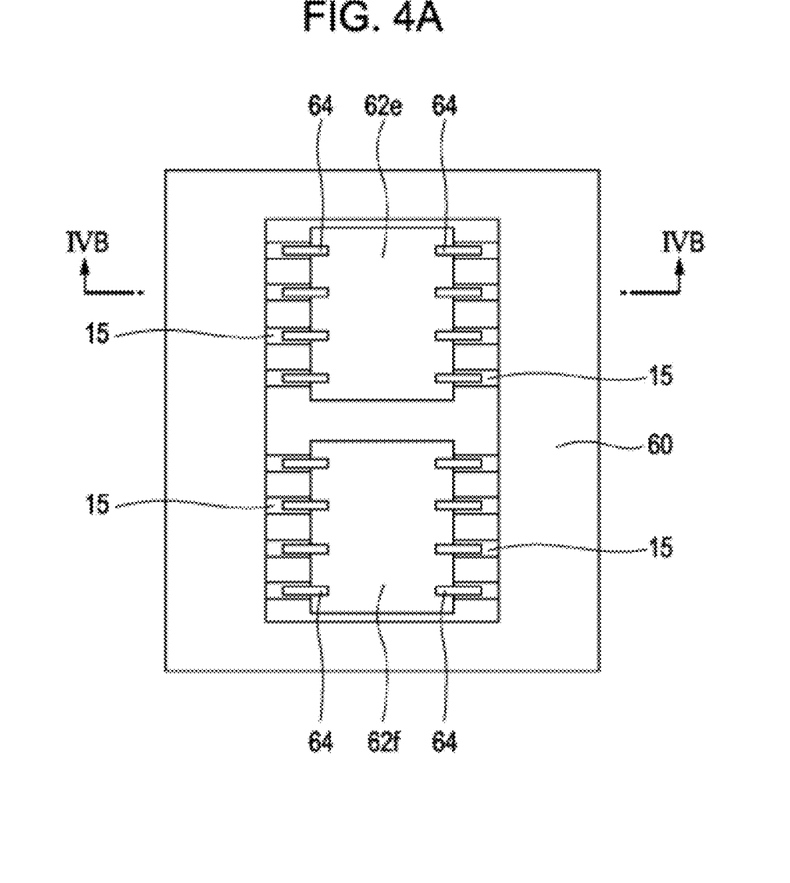
FIGS. 4A and 4B illustrate the mounting of electronic components and the formation of wiring formed by causing the metal-to-insulator transition material to transition to a metallic phase according to an embodiment of the present invention.
Figure 4B:
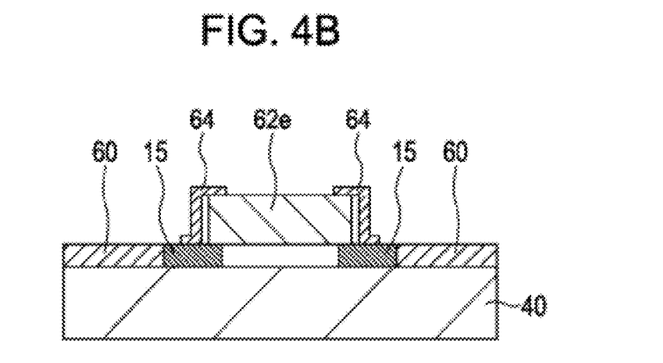

FIGS. 4A and 4B illustrate the mounting of electronic components and the formation of wiring formed by causing the metal-to-insulator transition material (VO$_2$) to transition to the metallic phase according to an embodiment of the present invention. FIG. 4A is a plan view. FIG. 4B is a cross-sectional view taken along line IVB-IVB. FIGS. 4A and 4B show an exemplary structure in which semiconductor chips 62e and 62f are mounted on the substrate 40.

An insulating layer composed of the metal-to-insulator transition material 60 (VO$_2$) used for electrical wiring and electrodes 15 are formed on the substrate 40 prior to the mounting of the semiconductor chips 62e and 62f, as described below.

The electrodes 15 are formed on a surface of the substrate 40, and then the insulating layer composed of the metal-to-insulator transition material 60 (VO$_2$) used for the electrical wiring. Alternatively, the insulating layer composed of the metal-to-insulator transition material 60 (VO$_2$) used for the electrical wiring is formed, and then the electrodes 15 is formed. Ends of the insulating layer composed of the metal-to-insulator transition material 60 (VO$_2$) are in contact with ends of the electrodes 15. Alternatively, the ends thereof are located outside a region where the semiconductor chips 62e and 62f are mounted, and the insulating layer composed of the metal-to-insulator transition material 60 (VO$_2$) overlaps the electrodes 15 in the vicinities of the ends.

After the formation of the insulating layer composed of the metal-to-insulator transition material 60 (VO$_2$) and the electrodes 15, connecting terminals of the semiconductor chips 62e and 62f are connected to the electrodes 15 through electrode leads 64, thereby mounting the semiconductor chips 62e and 62f on the substrate 40.

After the mounting of the semiconductor chips 62e and 62f on the substrate 40, the insulating layer composed of the metal-to-insulator transition material 60 (VO$_2$) is irradiated with laser light in such a manner that desired electrodes 15 are connected to each other, causing irradiated regions to transition to the metallic phases and thus forming electrical wiring constituting an electronic circuit.

The whole or part of the resulting electrical wiring constituting the electronic circuit can be erased as described above (see FIGS. 2 and 3A (a) to 3C (b)).

Formation and Erasure of Multilayer Wiring

Figure 5:
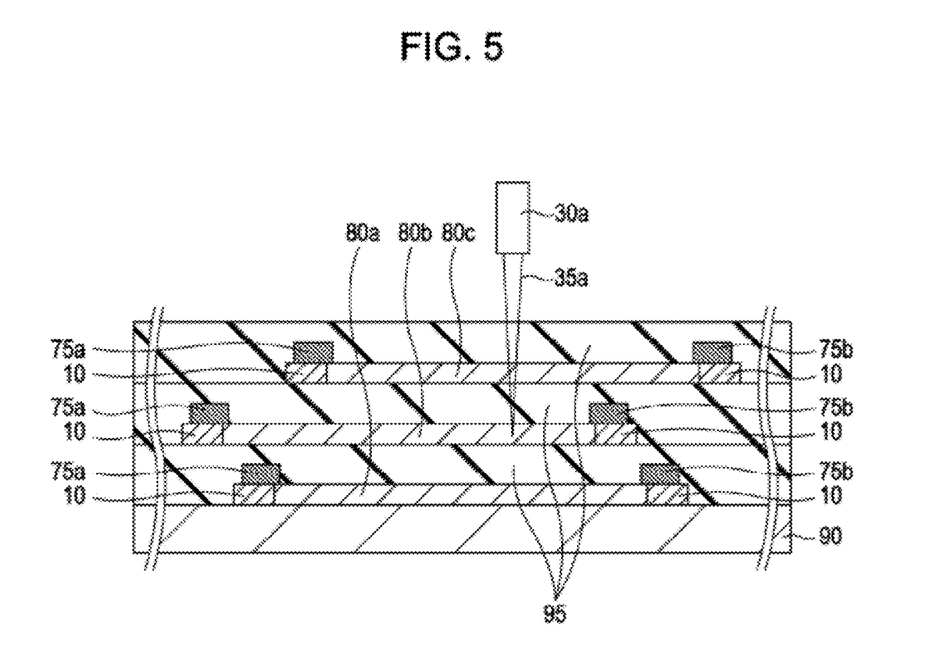
FIG. 5 is a cross-sectional view illustrating the formation and the erasure of multilayer wiring according to an embodiment of the present invention, the wiring being formed by causing a metal-to-insulator transition material to transition to a metallic phase by laser scanning.

FIG. 5 is a cross-sectional view illustrating the formation and the erasure of multilayer wiring as an example of a functional element according to an embodiment of the present invention, the functional element being formed by causing a metal-to-insulator transition material (VO$_2$) to transition to a metallic phase by laser scanning.

The multilayer wiring shown in FIG. 5 includes electrical wiring 80a constituting a first wiring layer arranged on a surface of a substrate 90, electrical wiring 80b constituting a second wiring layer, and electrical wiring 80c constituting a third wiring layer, these layers being separated by insulating layers 95. To form the electrical wiring 80a, 80b, and 80c, first, second, and third insulating layers which are composed of the metal-to-insulator transition material 10 (insulator: $VO_2$) and which are used for the formation of the first, second, and third wiring layers are formed in advance. Electrodes 75a and 75b are formed on predetermined portions of each of the insulating layers.

To form the electrical wiring by causing each of the first to third insulating layers to transition from the insulator phase to the metallic phase, the focal length of laser light is adjusted by a lens. The laser light is converged and focused on each insulating layer by the lens, thereby forming a laser spot at an adjusted depth of focus. Each insulating layer is two-dimensionally scanned with the laser spot, causing a desired region of each insulating layer to transition from the insulator phase to the metallic phase by laser irradiation and thus forming the electrical wiring. In this way, the three-dimensionally arranged electrical wiring can be formed.

The metal-to-insulator transition material 10 (insulator: $VO_2$) is two-dimensionally scanned with the laser spot formed by converging laser light 35a from a laser light source 30a with a converging lens, causing the metal-to-insulator transition material to transition from the insulator phase to the metallic phase and thus forming the electrical wiring at desired positions of desired layers. FIG. 5 shows a state in which the laser spot is incident on the second insulating layer.

It goes without saying that metallic wiring serving as a via plug configured to electrically connect different wiring layers to each other can be formed by forming the metal-to-insulator transition material 10 ($VO_2$) in advance in such a manner that different wiring layers are connected to each other.

A desired region of the electrical wiring formed in a desired layer is irradiated with a laser spot formed by converging infrared laser light serving as the laser light 35 using a converging lens (not shown), thereby erasing the three-dimensionally arranged electrical wiring, i.e., the electrical wiring arranged in a desired region in each layer, in the same way as described in FIG. 2. Thus, wiring can be rearranged by adding or erasing electrical wiring in the same way as described in FIGS. 3A (a) to 3C (b). That is, wiring can be rearranged by adding new wiring configured to connect between the layers or erasing electrical wiring.

Regarding the three-dimensionally arranged electrical wiring, the focal length of infrared laser light is adjusted by a lens. The infrared laser light is converged and focused on a target wiring layer by the lens, thereby forming a laser spot at an adjusted depth of focus. The target wiring layer is two-dimensionally scanned with laser spot, so that the target wiring layer is heated to a high temperature (e.g., about 100° C.) equal to or higher than a metal-to-insulator transition temperature and then cooled to a low temperature, i.e., room temperature, thereby erasing the target wiring layer.

The entire region of the target wiring layer is two-dimensionally scanned with the laser spot, erasing all electrical wiring in the wiring layer. A portion of the target wiring layer is scanned with the laser spot, erasing the portion of the electrical wiring in the wiring layer. The insulating layers 95 shown in FIG. 5 may have a transmittance adequate to transmit the laser light 35a and are composed of any material according to the purpose.

Examples of the formation and the erasure of the metallic wiring composed of the metal-to-insulator transition material ($VO_2$) by laser scanning will be described below.

EXAMPLES

Formation of Thin Film of Vanadium Oxide ($VO_2$)

A $VO_2$ thin film can be formed by pulsed laser deposition. An atmospheric gas is fed into a vacuum chamber so as to achieve a pressure of 10 Pa or less. A low-density plume is dispersed from a high-density plume. Fragments, e.g., atoms, molecules, ions, and clusters, emitted from the plasma of the target reach a surface of a substrate, thereby forming the $VO_2$ thin film on the surface of the substrate.

A vanadium pentoxide ($V_2O_5$) sintered compact (pellet) serving as a target and a $SiO_2$/Si wafer serving as a substrate were placed in a thin-film formation apparatus having an oxygen partial pressure of (1 to 3)$\times 10^{-2}$ Torr (1.3 to 4.0 Pa). The distance between the target and the substrate was set to 30 to 50 mm. The substrate temperature was set to 350° C. to 420° C. The target was subjected to 500 to 30,000 doses of laser light with a wavelength of 248 nm, a laser energy of 0.5 to 2 J/cm$^2$, a laser frequency of 1 to 10 Hz, and a pulse width of 20 ns/shot, thereby forming a 1 cm×1 cm crystalline vanadium oxide ($VO_2$) thin film having a thickness of 10 to 500 nm. Vanadium dioxide ($VO_2$), vanadium tetraoxide ($V_2O_4$), and vanadium trioxide ($V_2O_3$) can be used as the target material as well as vanadium pentoxide ($V_2O_5$).

In particular, a thin film with the best crystallinity was formed at a gas flow rate ($O_2$:Ar) of 1:1, an oxygen partial pressure of $1\times 10^{-2}$ Torr, a substrate temperature of 400° C., a laser frequency of 5 Hz, and a target-substrate distance of 50 mm. The resulting vanadium dioxide ($VO_2$) exhibits a phase transition (see FIG. 6) and has a insulating monoclinic crystal structure at room temperature and a conductive tetragonal structure at a transition temperature or higher.

Metal-to-Insulator Transition Properties of Vanadium Dioxide

Figure 6:
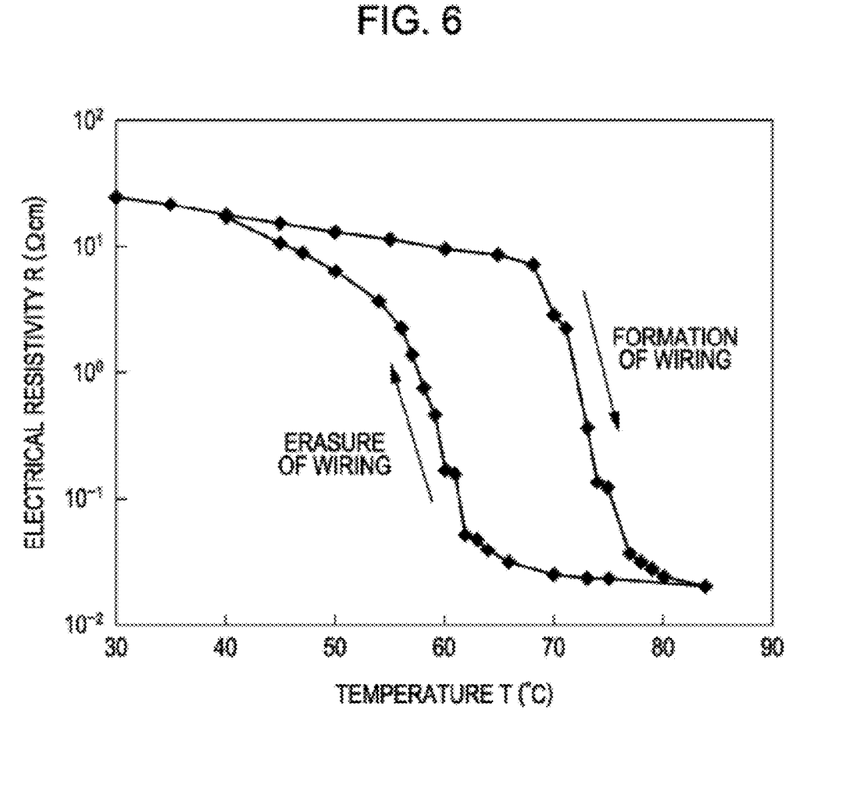
FIG. 6 shows metal-to-insulator transition properties of a vanadium dioxide thin film according to an example of the present invention.

FIG. 6 shows metal-to-insulator transition properties of a vanadium dioxide ($VO_2$) thin film according to an example of the present invention and the electrical resistivity of the $VO_2$ thin film determined by four-terminal measurement. In FIG. 6, the horizontal axis indicates the temperature (° C.) of the $VO_2$ thin film, and the vertical axis indicates the electrical resistivity (Ω·cm).

As shown in FIG. 6, when the temperature of the $VO_2$ thin film is increased by heating, the electrical resistivity is gradually decreased up to about 68° C. (hereinafter, this change is referred to as a "gradually decreasing curve"). The electrical resistivity is steeply decreased with further increasing temperature. At about 77° C. or higher, the electrical resistivity is gradually decreased. In the range of about 68° C. to about 77° C. (hereinafter, the change in this range shown in FIG. 6 is referred to as a "temperature-increasing curve"), the $VO_2$ thin film undergoes the metal-to-insulator transition to change from the insulator phase as a low-temperature phase to the metallic phase as a high-temperature phase. In this way, the insulator phase of the $VO_2$ thin film undergoes the phase transition to the metallic phase, thereby forming the wiring.

As shown in FIG. 6, when the temperature of the $VO_2$ thin film is decreased by cooling, the electrical resistivity is gradually increased up to about 63° C. (hereinafter, the change is referred to as a "gradually increasing curve"). The electrical resistivity is steeply increased with further decreasing temperature. At about 56° C. or lower, the electrical resistivity is gradually increased. In the range of about 63° C. to about 56° C. (hereinafter, the change shown in FIG. 6 is referred to as a "temperature-decreasing curve"), the $VO_2$ thin film undergoes the metal-to-insulator transition to change from the metallic phase as a high-temperature phase to the insulator phase as a low-temperature phase. In this way, the metallic phase of the $VO_2$ thin film undergoes the phase transition to the insulator phase, thereby erasing the wiring.

As shown in FIG. 6, the change in the electrical resistivity of the $VO_2$ thin film with temperature shows a hysteresis loop. The midpoint of the temperature-increasing curve is defined as a phase-transition temperature and determined to be about 73° C. The midpoint of the temperature-decreasing curve is defined as a phase-transition temperature and determined to be about 60° C. That is, the width of the hysteresis is about 13° C.

In the case where the temperature of the $VO_2$ thin film is decreased at a state indicated by a point on the temperature-increasing curve, the electrical resistivity of the $VO_2$ thin film is not changed along the temperature-increasing curve but is changed along a line substantially parallel to the gradually-decreasing curve, so that the electrical resistivity of the $VO_2$ thin film is not significantly changed. Similarly, in the case where the temperature of the $VO_2$ thin film is increased at a state indicated by a point on the temperature-decreasing curve, the electrical resistivity of the $VO_2$ thin film is not changed along the temperature-decreasing curve but is changed a line substantially parallel to the gradually-increasing curve, so that the electrical resistivity of the $VO_2$ thin film is not significantly changed.

As described above, the $VO_2$ thin film is changed from the insulator phase to the metallic phase according to the temperature-increasing curve. The $VO_2$ thin film is changed from the metallic phase to the insulator phase according to the temperature-decreasing curve. That is, the $VO_2$ thin film exhibits a reversible metal-to-insulator transition. In the case where the $VO_2$ thin film is formed on a sapphire, the electrical resistivity of the $VO_2$ thin film is about $1 \times 10^{-3}$ $\Omega \cdot cm$, which is comparable to that of a transparent electrode. This is probably because the crystal grain size is increased. Thus, although the electrical resistivity of the metallic phase of the $VO_2$ thin film shown in FIG. 6 is about $2 \times 10^{-2}$ $\Omega \cdot cm$, an increase in the crystal grain size by increasing the thickness of the $VO_2$ thin film to about 10 μm may reduce the electrical resistivity of the metallic phase of the $VO_2$ thin film to about $1 \times 10^{-4}$ $\Omega \cdot cm$.

Formation of Metallic Wiring

A $VO_2$ thin film having a thickness of 100 nm was formed on a surface of a $SiO_2$ substrate by pulsed laser deposition described above. Two electrodes formed of evaporated aluminum films each having a thickness of 50 nm were formed on the surface of the $VO_2$ thin film as described in FIGS. 1A and 1B. Thin metallic leads were formed between the two electrodes with laser light having a wavelength of 488 nm.

Figure 7A:
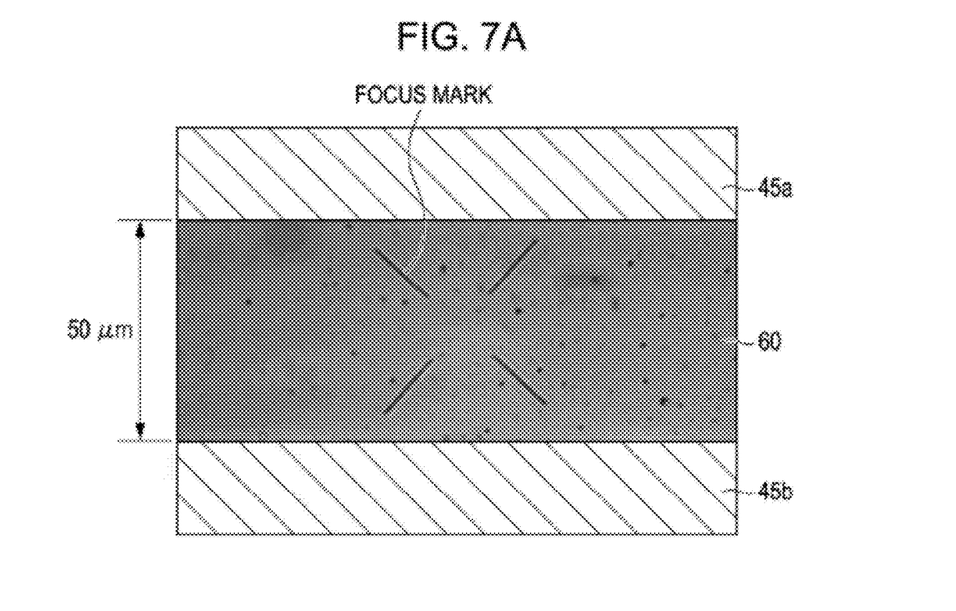
FIGS. 7A and 7B illustrate the formation of wiring according to an example of the present invention, the wiring being formed by causing a metal-to-insulator transition material to transition to a metallic phase by laser scanning.
Figure 7B:
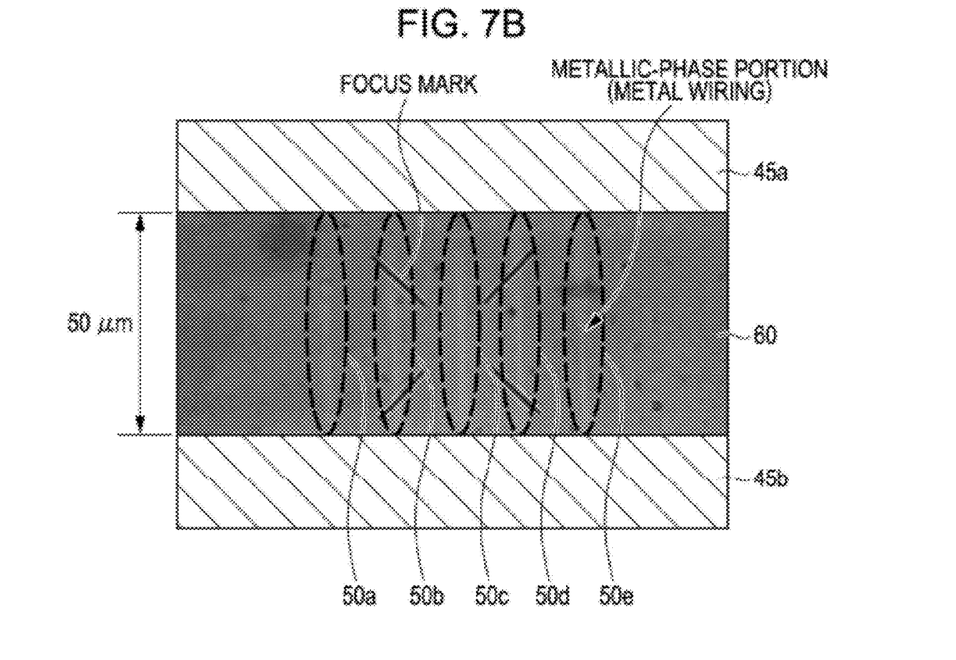
Figure 8A:
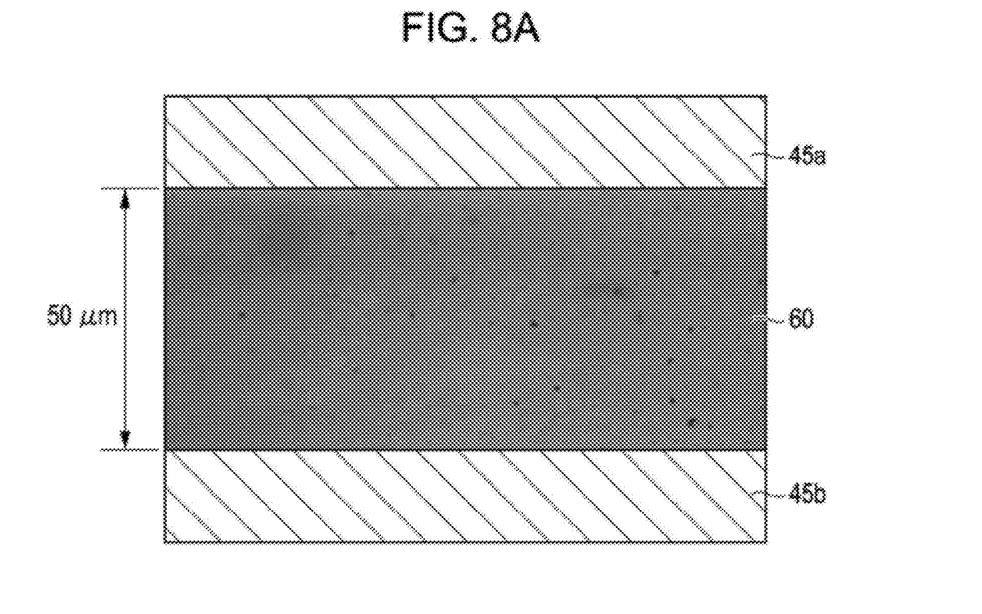
FIGS. 8A and 8B illustrate the formation of wiring according to an example of the present invention, the wiring being formed by causing a metal-to-insulator transition material to transition to a metallic phase by laser scanning.
Figure 8B:
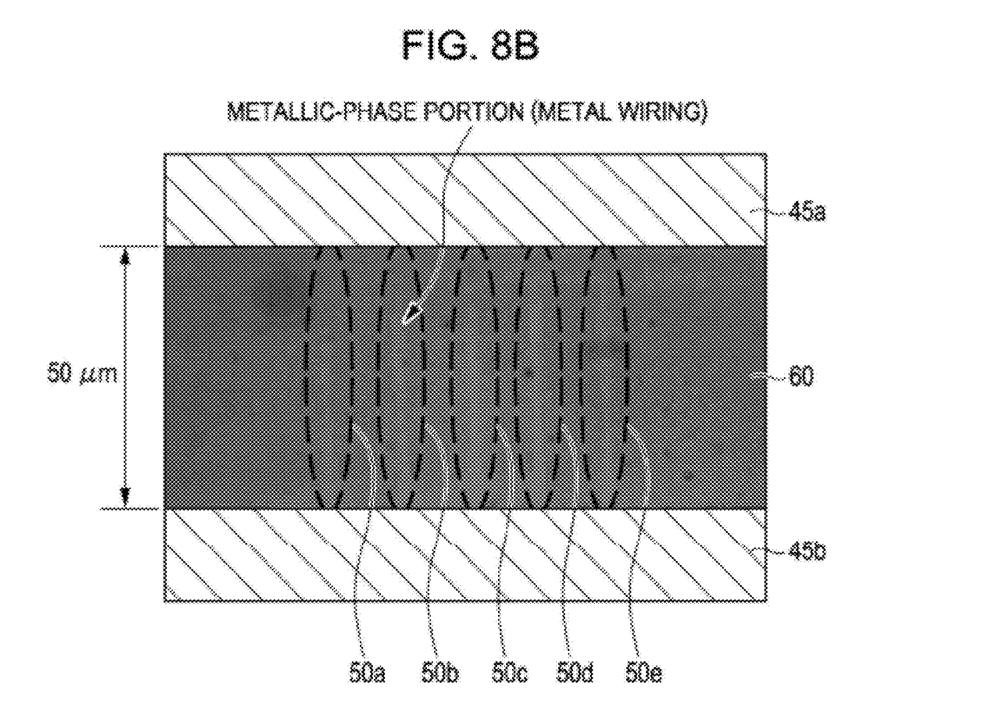

FIGS. 7A to 8B show the formation of exemplary metallic wiring as a functional element according to an example of the present invention, the functional element being formed by causing a metal-to-insulator transition material ($VO_2$) to transition to a metallic phase. FIGS. 7A and 8A are optical photomicrographs of a vanadium dioxide ($VO_2$) thin film before laser scanning. FIGS. 7B and 8B are optical photomicrographs of the vanadium dioxide ($VO_2$) thin film after laser scanning. In FIGS. 7A and 7B, a focus mark is shown. In FIGS. 8A and 8B, the focus mark is not shown.

As shown in FIGS. 7A and 8A, two Al electrodes 45*a* and 45*b* parallel to each other are arranged on a surface of the metal-to-insulator transition material 60 ($VO_2$) and separated by 50 μm.

Each of FIGS. 7B and 8B shows five leads 50*a*, 50*b*, 50*c*, 50*d*, and 50*e* formed by causing the metal-to-insulator transition material ($VO_2$) to transition from the insulator phase to the metallic phase so as to connect the Al electrodes 45*a* and 45*b*. Each of the leads is linearly arranged in a region surrounded by a corresponding one of the dotted lines. Each of the leads 50*a* to 50*e* has a width of about 2 μm. The width of the leads can be changed by adjusting the degree of concentration of laser light.

Each of the leads 50*a* to 50*e* shown in FIGS. 7B and 8B is observed to be yellow in an actual field of view of an optical microscope. This color is the same as a color observed when the metal-to-insulator transition material 60 ($VO_2$) undergoes the phase transition from the insulator phase to the metallic phase by a change in temperature. That is, the color indicates that the metal-to-insulator transition is induced by laser light.

Figure 9A:
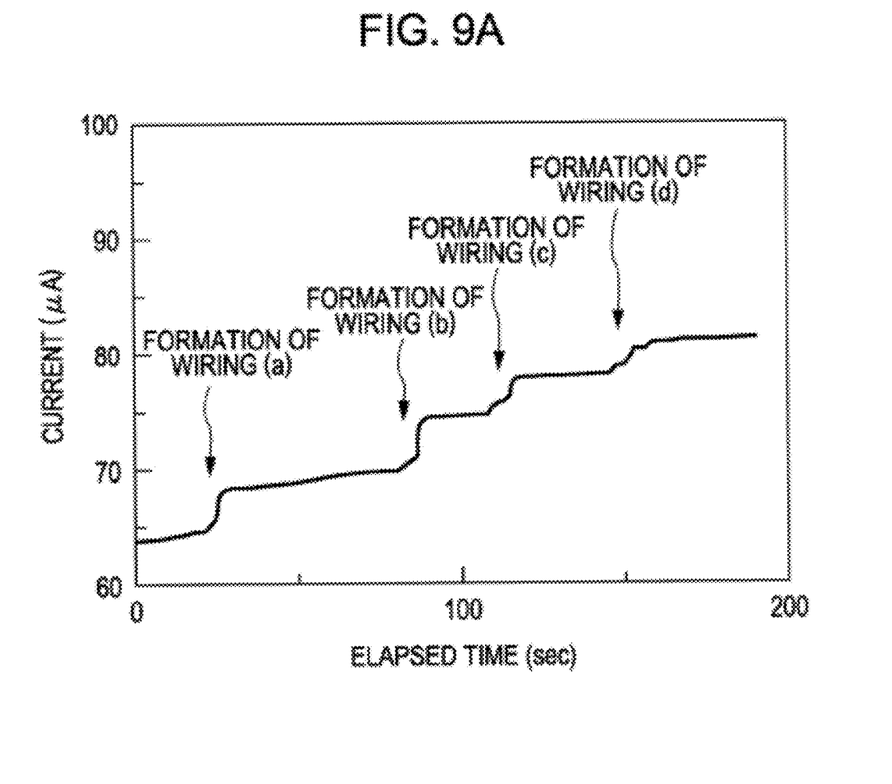
FIGS. 9A and 9B illustrate the formation of wiring according to an example of the present invention.
Figure 9B:
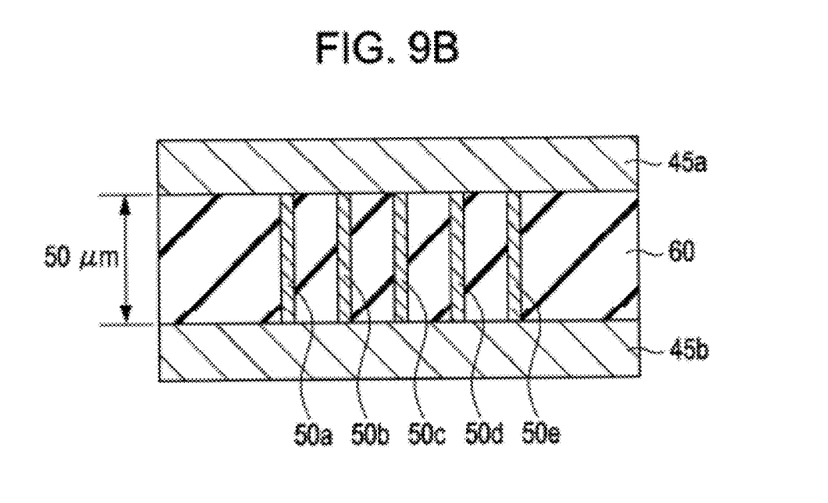

FIGS. 9A and 9B illustrate the formation of exemplary metallic wiring as a functional element according to an example of the present invention. FIG. 9A is a graph showing a change in current flowing between the electrodes when the leads (a, b, c, d, and e) are formed by causing the metal-to-insulator transition material ($VO_2$) to transition to the metallic phase by laser scanning (formation of wiring with laser light). FIG. 9B schematically shows the photomicrographs of FIGS. 7B and 8B and is a plan view of the leads (a, b, c, d, and e) and the arrangement of the electrodes on the $SiO_2$ substrate.

In FIG. 9A, the horizontal axis indicates the elapsed time for the formation of the leads a, b, c, d, and e by causing the metal-to-insulator transition material ($VO_2$) to transition to the metallic phase by laser scanning when the leads shown in FIGS. 7A to 8B are formed. The vertical axis indicates the current flowing between the Al electrodes 45*a* and 45*b*. As shown in FIG. 9A, substantially the same amount of current flowing between the Al electrodes 45*a* and 45*b* is increased stepwise in every completion of the formation of the leads a, b, c, d, and e. The results clearly show that the metallic leads 50*a* to 50*e* are sequentially formed between the Al electrodes 45*a* and 45*b*.

The resulting electrical wiring shown in FIGS. 9A and 9B was erased by heating the $VO_2$ thin film to about 100° C. with a heater and cooling the film to room temperature. An optical photomicrograph (not shown) of the $VO_2$ thin film in which the electrical wiring has been erased is the same as in FIGS. 7A and 8A. The film was observed to be yellow in an actual field of view of an optical microscope.

As described above, in an embodiment of the present invention, the transition metal oxide mainly composed of vanadium dioxide ($VO_2$) is used as the metal-to-insulator transition material in which the low-temperature phase has a high electrical resistivity and the high-temperature phase has a low electrical resistivity. It is thus possible to erase the wiring by heating the metallic phase constituting the wiring to 100° C. or less to cause the metallic phase to transition to the insulator phase. Hence, the rearrangement of the wiring can be performed without damaging an electronic component (element) such as a semiconductor chip mounted or formed on a device even after the electronic component is mounted or formed on the device.

In the foregoing description, the erasable electrical wiring serving as the functional element for use in an electronic circuit has been taken as an example. Also in the case where the functional element serves as a resistance element of an electronic circuit, a relay switch, an optical storage element of an optical storage medium, or a display element of a display unit, the functional element composed of a transition metal oxide mainly containing $VO_2$ can be formed and erased in the same way as the electrical wiring in the electronic circuit.

In an embodiment of the present invention described above, the functional element that is composed of $VO_2$ as the metal-to-insulator transition material and erasable by laser irradiation is formed. Thus, the following features are provided.

(1) Electrical wiring composed of $VO_2$ is formed. The electrical wiring can be erased by heating the wiring to about 100° C. It is thus possible to provide the electrical wiring erasable at a low temperature, which has been difficult to realize in the past.

(2) It is possible to form the electrical wiring in a step after a desired electronic component is mounted on a substrate. That is, it is possible to perform a step of forming the electrical wiring after mounting the component.

(3) It is possible to provide an erasable semiconductor logic element (reconfigurable element) by forming and erasing the electrical wiring composed of $VO_2$. The reconfigurable element is an erasable logic element. A typical example of the reconfigurable element is a field programmable grid array (FPGA). The logic element can be reconfigured by a user. The element has already been used practically for semiconductor design and a semiconductor operation test. Furthermore, the element is also used in an artificial-intelligence device such as a robot because of the reconfigurability as brain synapses.

(4) It is effective to change the layout of organic semiconductor devices and circuits using the devices susceptible to damage from process steps (e.g., organic field-effect transistors (FETs including channels composed of organic semiconductors) and organic electroluminescent devices). Since the electrical wiring composed of $VO_2$ can be erased at a heating temperature of about 100° C., channels composed of organic semiconductor materials and organic electroluminescent materials are not degraded.

(5) The width of the electrical wiring can be changed by adjusting the area of laser irradiation on forming the electrical wiring composed of $VO_2$. Thus, the circuit can be changed in response to the strength of an electric signal.

(6) In the case where $VO_2$ is combined with a light-emitting element such as a laser element, $VO_2$ is reversibly subjected to the metal-to-insulator transition by the irradiation of laser light emitted from the laser element. It is thus possible to form a circuit element that can be reconfigured in real time. It is possible to change the wiring on a substrate on which a desired electronic component is mounted as described in item (2) or the wiring on the semiconductor element described in item (3) during the operation of the element. For example, the lamp (laser) shown in FIGS. 3C (a) is combined with an MEMS element into a package. It is possible to provide a device that can rearrange wiring in a chip by photolithography in a submicron scale.

(7) A relay switch can be formed by the use of the reversible metal-to-insulator transition of $VO_2$ caused by laser irradiation. The movement control of the laser element with the relay switch and a micro electro mechanical system (MEMS) device results in the formation of a logic circuit using an optical signal. Here, the component as described in item (2) and the element as described in item (3) operate not on electric signals but on optical signals. The metallic phase of $VO_2$ does not transmit light (optical signal) because of the reflection of light or its nontransparency, resulting in a state in which wiring is not formed, i.e., a state in which the circuit is switched off. The insulator phase of $VO_2$ transmits light (optical signal), resulting in a state in which wiring is formed, i.e., a state in which the circuit is switched on. In the case of using an optical signal, the metallic phase of $VO_2$ provides the state in which the wiring is not formed, i.e., the state in which the circuit is switched off, and the insulator phase of $VO_2$ provides the state in which the wiring is formed, i.e., the state in which the circuit is switched on. In contrast, in the case of using an electric signal, the metallic phase of $VO_2$ provides a state in which wiring is formed, i.e., a state in which the circuit is switched on, and the insulator phase of $VO_2$ provides a state in which wiring is not formed, i.e., a state in which the circuit is switched off. That is, the case of using the optical signal is opposite to the case of using an electric signal.

(8) Changes in the focal length and the depth of focus with the converging lens used for laser light incident on $VO_2$ result in changes in the diameter and the depth position of the laser spot. The depth position (depth of focus) of the laser spot is three-dimensionally changed, forming a three-dimensionally arranged thin metallic line network. Furthermore, $VO_2$ nanoparticles are mixed and dispersed in a transparent material (e.g., a transparent resin or transparent glass) for laser light. In this case, it is possible to form and erase a thin metallic line network having a three-dimensional structure as desired.

(9) The wiring composed of the metallic phase of $VO_2$ is colored, thus resulting in the visualization of the wiring. It is thus possible to change the circuit while visually monitoring the state of the formation of the wiring.

(10) It is possible to perform two- or three-dimensional drawing by the use of coloring resulting from the phase transition of $VO_2$. An electronic signboard can be formed. Drawing is performed by laser light emitted from a laser pointer including a laser element. $VO_2$ is subjected to the reversible metal-to-insulator transition, resulting in coloring. Thereby, a drawing medium using coloring resulting from the phase transition can also be provided. Such a drawing medium can be placed in a public place and used as a reusable display that serves as a ubiquitous information medium.

(11) It is possible to provide an optical storage element of an optical storage medium by the use of the difference in terms of light transmittance resulting from the phase transition of $VO_2$.

(12) It is possible to form an erasable resistance element for a voltage circuit by the use of a change in the electrical resistivity with temperature, the electrical resistivity of the resistance element being controlled by the heating temperature of $VO_2$.

While the embodiments of the present invention have been described above, the present invention is not limited to these embodiments. Various changes and modifications can be made without departing from the spirit and scope of the invention. For example, the $VO_2$ thin film can be formed by various methods. The $VO_2$ thin film can be formed on a surface of a substrate while the temperature of the substrate is set to 100° C. or lower. Furthermore, a material other than $VO_2$ may be used as long as the material undergoes a metal-to-insulator transition at a temperature of room temperature to 100° C.

The present application contains subject matter related to that disclosed in Japanese Priority Patent Application JP 2009-062759 filed in the Japan Patent Office on Mar. 16, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for forming a functional element, comprising:
    forming a plurality of insulating layers that are stacked, each insulating layer being composed of an insulator phase of a transition metal oxide serving as a metal-to-insulator transition material, the transition metal oxide comprising vanadium dioxide; and using laser irradiation to cause a part of each of the insulating layers to transition to a metallic phase to form a respective electrical wiring in each of the insulating layers, using the laser irradiation including focusing a laser spot on each insulating layer, the laser spot formed by converging laser light from a laser light source, and selectively scanning each insulating layer with the laser spot so as to form the respective electrical wiring in a desired region of the insulting layer, wherein, the insulator phase differs from the metallic phase in terms of at least electrical resistivity.

2. The method according to claim 1, further comprising:

causing at least a part of the metallic phase in one or more insulating layers to transition to the insulator phase to erase at least a portion of the electrical wiring.

3. The method according to claim 2, wherein at least the part of the metallic phase is heated to a temperature higher than a metal-to-insulator transition temperature of the transition metal oxide and equal to or lower than 100° C. and then cooled to a temperature lower than the metal-to-insulator transition temperature, causing the part of the metallic phase to transition to the insulator phase.

4. The method according to claim 3, wherein the transition metal oxide contains at least one 3d transition metal element other than vanadium (V).

5. The method according to claim 4, wherein the 3d transition metal element is selected from Ti, Cr, Mn, Fe, Co, Ni, and Cu.

6. The method according to claim 1, wherein in using the laser irradiation, a region of the insulating layer located between a plurality of conductors is subjected to the laser irradiation to form the metallic phase such that the conductors are connected to each other.

7. The method according to claim 1, wherein multilayer three-dimensionally arranged electrical wiring is formed.

8. The method according to claim 1, wherein the functional element includes a relay switch.

9. The method according claim 1, wherein the laser light is converged using a converging lens.

10. The method according to claim 9, wherein the laser spot is focused on each insulating layer using the converging lens.

11. The method according to claim 9, wherein a focal length of the laser light is adjusted using the converging lens.

12. The method according to claim 1, wherein a depth position of the laser spot is changed by adjusting a depth of focus.

\* \* \* \* \*